US009190422B2

(12) United States Patent
Hong

(10) Patent No.: US 9,190,422 B2
(45) Date of Patent: Nov. 17, 2015

(54) DISPLAY DEVICE AND METHOD OF MANUFACTURING THE SAME

(71) Applicant: LG Display Co., Ltd., Seoul (KR)

(72) Inventor: HyunSeok Hong, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/326,264

(22) Filed: Jul. 8, 2014

(65) Prior Publication Data

US 2015/0091014 A1 Apr. 2, 2015

(30) Foreign Application Priority Data

Sep. 27, 2013 (KR) .................. 10-2013-0115382

(51) Int. Cl.
*H01L 27/12* (2006.01)

(52) U.S. Cl.
CPC .......... *H01L 27/124* (2013.01); *H01L 27/1248* (2013.01)

(58) Field of Classification Search
CPC .............. H01L 27/1214; H01L 27/124; G02F 1/13338; G06F 3/0412; G06F 2203/04103
See application file for complete search history.

(56) References Cited

U.S. PATENT DOCUMENTS

2007/0034954 A1* 2/2007 Cho et al. ...................... 257/347

* cited by examiner

*Primary Examiner* — Tucker Wright

(74) *Attorney, Agent, or Firm* — Fenwick & West LLP

(57) ABSTRACT

A display device and a method of manufacturing the same are disclosed, in which a sensing electrode for sensing a touch of a user is built in a display panel, whereby a separate touch screen is not required on an upper surface of the display panel and thus thickness and manufacturing cost are reduced.

18 Claims, 20 Drawing Sheets

DISPLAY DEVICE AND METHOD OF MANUFACTURING THE SAME

CROSS REFERENCE TO RELATED APPLICATIONS

This application claims the benefit of the Korean Patent Application No. 10-2013-0115382 filed on Sep. 27, 2013, which is incorporated by reference herein.

BACKGROUND OF THE INVENTION

1. Field of the Invention

The present invention relates to a display device, and more particularly, to a display device provided with a sensing electrode for sensing a touch of a user.

2. Discussion of the Related Art

Various display devices such as a liquid crystal display device, a plasma display panel, and an organic light emitting display device have been developed.

Traditional display devices often include a mouse and a keyboard as input means. However, a touch screen, that allows a user to directly input information by using his/her finger or pen is often utilized in devices such as navigation systems, a portable terminals, and home appliances.

Hereinafter, a liquid crystal display device to which a touch screen is applied will be described in detail.

FIG. 1 is a brief cross-sectional view illustrating a liquid crystal display of the related art.

As shown in FIG. 1, the liquid crystal display device of the related art includes a liquid crystal panel 10 and a touch screen 20.

The liquid crystal panel 10 displays images, and includes a lower substrate 12, an upper substrate 14, and a liquid crystal layer 16 formed between these substrates 12 and 14.

The touch screen 20 is formed on an upper surface of the liquid crystal panel 10 to sense a touch of a user, and includes a touch substrate 22, a first sensing electrode 24 formed on a lower surface of the touch substrate 22, and a second sensing electrode 26 formed on an upper surface of the touch substrate 22.

The first sensing electrode 24 is arranged on the lower surface of the touch substrate 22 in a horizontal direction, and the second sensing electrode 26 is arranged on the upper surface of the touch substrate 22 in a vertical direction. Accordingly, if the user touches a predetermined position, capacitance between the first sensing electrode 24 and the second sensing electrode 26 is varied at the touched position. As a result, the position where capacitance is varied is sensed, whereby the touch position of the user may be sensed.

However, since the aforementioned liquid crystal display device of the related art has a structure in which the touch screen 20 is separately formed on the upper surface of the liquid crystal panel 10, the overall thickness of the display device is increased due to the touch screen 20 and the manufacturing cost is also increased.

SUMMARY OF THE INVENTION

Accordingly, the present invention is directed to a display device and a method of manufacturing the same, which substantially obviate one or more problems due to limitations and disadvantages of the related art.

An advantage of the present invention is to provide a display device and a method of manufacturing the same, in which a sensing electrode for sensing a touch of a user is built in a display panel, whereby a separate touch screen is not required on an upper surface of the display panel. Thus, thickness and manufacturing costs are reduced.

Additional advantages and features of the invention will be set forth in the description which follows and will be apparent to those having ordinary skill in the art upon reading this disclosure. The objectives and other advantages of the invention may be realized and attained by the structure particularly pointed out in the written description and claims hereof as well as the appended drawings.

To achieve these objects and other advantages as embodied and broadly described herein, a display device according one embodiment comprises a thin film transistor formed in a pixel region comprising a gate line and a data line crossing the gate line, the thin film transistor including a gate electrode, a semiconductor layer, a source electrode, and a drain electrode; a first passivation film formed on the thin film transistor; a second passivation film formed on the first passivation film, the first and second passivation films structured such that a hole exists through the first and second passivation films that at least partially exposes the source electrode and the drain electrode from the first and second passivation films; a pixel electrode formed on the second passivation film and at least partially filling the hole through the first and second passivation films, the pixel electrode connected with the drain electrode via the hole through the first and second passivation films; a sensing line formed on the second passivation film; a common electrode connected with the sensing line; a data pad connected with one end of the data line; a first connection electrode formed on the data pad and connected with the data pad; a second connection electrode formed on the first connection electrode and connected with the first connection electrode; and a data pad electrode formed of a same material as the common electrode, the data pad electrode connected with the data pad through the first connection electrode and the second connection electrode.

In another embodiment, a method of manufacturing a display device comprises the steps of sequentially forming a first semiconductor layer and a source/drain electrode layer on a surface of a substrate on which a gate electrode and a gate insulating film are formed; simultaneously patterning the semiconductor layer and the source/drain electrode layer to form a first pattern in a thin film transistor region and to form a second pattern in a data pad region, the first pattern comprising a first portion of the semiconductor layer and a first portion of the source/drain electrode layer, and the second pattern comprising a second portion of the semiconductor layer and a data pad formed from a second portion of the source/drain electrode layer; sequentially forming first and second passivation films such that a hole exists through the first and second passivation films through which at least a part of the source/drain electrode layer is exposed in the thin film transistor region including the first pattern; sequentially forming a second material layer and a third material layer on the second passivation film; forming a sensing line pattern, a pixel electrode pattern, and a connection electrode pattern connected with the data pad by patterning the second and third material layers through a patterning process using a half tone mask; forming a third passivation film on the sensing line pattern, the pixel electrode pattern, and the connection electrode pattern; and forming a common electrode connected with the sensing line pattern and a data pad electrode connected with the connection electrode pattern on the third passivation film.

In another embodiment, a display device comprises: a thin film transistor formed in a pixel region comprising a gate line and a data line crossing the gate line, the thin film transistor comprising a gate electrode, a semiconductor layer, a source electrode, and a drain electrode; a first passivation film formed on the thin film transistor; a second passivation film formed on the first passivation film, the first and second passivation films structured such that a hole exists through the first and second passivation films that at least partially exposes the drain electrode from the first and second passivation films; a pixel electrode formed on the second passivation film and the drain electrode and at least partially filling the hole through the first and second passivation films, the pixel electrode connected with the drain electrode via the hole through the first and second passivation films; a sensing line formed on the second passivation film; a common electrode connected with the sensing line; a data pad connected with one end of the data line; and a data pad electrode formed of a same material as the common electrode, the data pad electrode connected with the data pad.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

The term "on" is used herein to describe an element directly in contact with another element, or to describe an element that is positioned over another element (in a cross-sectional view) with one or more intervening elements in between.

The terminologies such as "first" and "second" disclosed in this specification do not mean the order of corresponding elements and are intended to identify the corresponding elements from each other.

Hereinafter, the embodiment of the present invention will be described with reference to the accompanying drawing.

Figure 1:
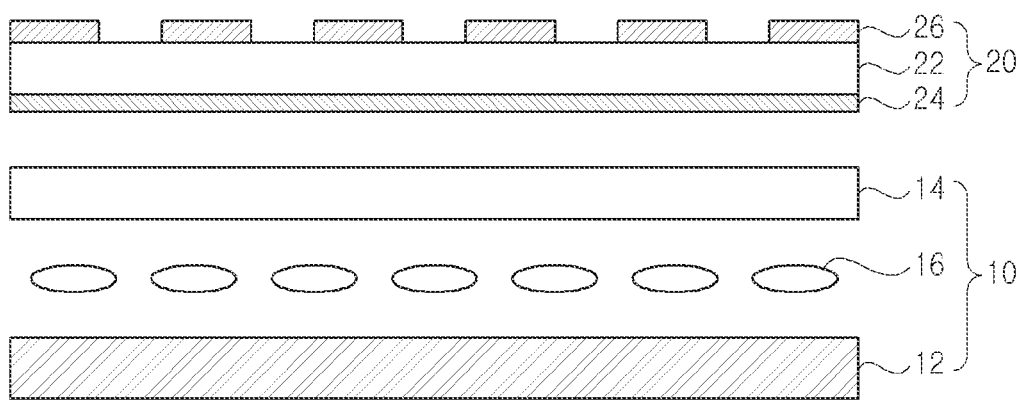
FIG. 1 is a brief cross-sectional view illustrating a liquid crystal display of the related art.
Figure 2:
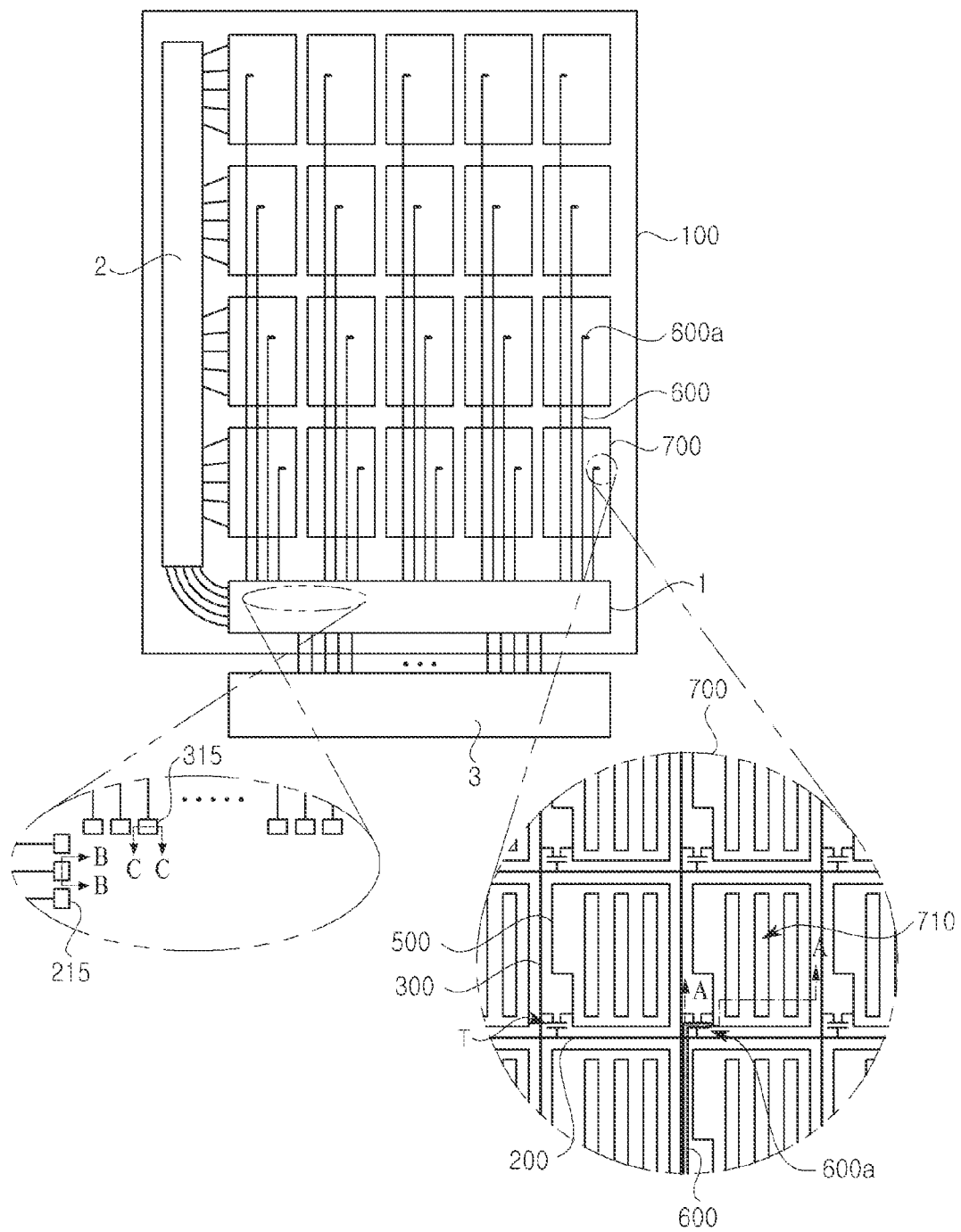
FIG. 2 is a brief plane view illustrating a substrate for a display device according to one embodiment of the present invention.

FIG. 2 is a brief plane view illustrating a substrate for a display device according to one embodiment of the present invention. For reference, an enlarged view shown by an arrow in FIG. 2 is intended to show a pixel region where a sensing line 600 and a common electrode 700 are electrically connected with each other.

As shown in FIG. 2, the display device according to one embodiment of the present invention includes a substrate 100, a gate line 200, a data line 300, a thin film transistor T, a pixel electrode 500, a sensing line 600, a common electrode 700, a driving integrated circuit 1, a gate in panel 2, and a touch driver 3. The gate in panel 2 comprises a gate driving circuit integrated with a panel.

The substrate 100 may be made of glass or transparent plastic.

The gate line 200 is arranged on the substrate 100 in a first direction, for example, a horizontal direction. One end of the gate line 200 is connected with the gate in panel 2, and the gate in panel 2 is connected with the driving integrated circuit 1 through a gate pad 215. Accordingly, a gate signal applied from the driving integrated circuit 1 is transferred to the gate line 200 through the gate pad 215 and the gate in panel 2.

The data line 300 is arranged on the substrate 100 in a second direction different from the first direction, for example, a vertical direction. In this way, the gate line 200 and the data line 300 are arranged to cross each other, whereby a plurality of pixel regions are defined. One end of the data line 300 is connected with the driving integrated circuit 1 through a data pad 315. Accordingly, a data signal applied from the driving integrated circuit 1 is transferred to the data line 300 through the data pad 315. Although the data line 300 is arranged in a straight line as shown, the data line 300 may be arranged in a curved line or a pattern of curved and/or straight line such as a zigzag shape.

The thin film transistor T is a switching element, and is formed in each of the plurality of pixel regions. Although not shown in detail, the thin film transistor includes a gate electrode connected with the gate line 200, a semiconductor layer serving as a channel to which electrons are moved, a source electrode connected with the data line 300, and a drain electrode formed to face the source electrode. This thin film transistor T may be formed in various shapes known in the art, such as a top gate structure and a bottom gate structure.

The pixel electrode 500 is patterned in each of the plurality of pixel regions. This pixel electrode 500 is connected with the drain electrode of the thin film transistor T.

Since the sensing line 600 is connected with the common electrode 700, the sensing line 600 serves to transfer a touch signal of a user, which is sensed by the common electrode 700, to the touch driver 3. To transfer the touch signal of the user, a plurality of sensing lines 600 are connected with a plurality of common electrodes 700 in pairs. In other words, each of the plurality of sensing lines 600 is connected with each of the plurality of common electrodes 700 in a one-to-one configuration.

In order to prevent light transmittance from being reduced by the sensing line 600, the sensing line 600 is formed over the data line 300.

In one embodiment, the sensing line 600 includes a contact portion 600a extended towards the thin film transistor T region, whereby the sensing line 600 may be connected with the common electrode 700 through the contact portion 600a. The thin film transistor T region is the region where image is not displayed, and is wider than the data line 300. Accordingly, if the contact portion 600a is formed to connect with the common electrode 700 at the thin film transistor T region, a more reliable connection between the sensing line 600 and the common electrode 700 may be made without reduction of light transmittance. In other words, since the sensing line 600 and the common electrode 700 are connected with each other through a predetermined contact hole, for reliable connection between them, the width of the sensing line 600 is preferably a predetermined range or more. Accordingly, the contact portion 600a is formed to have a width greater than that of the data line 300, whereby the sensing line 600 and the common electrode 700 may be connected with each other more reliably.

In other embodiment, the sensing line 600 does not include the contact portion 600a, and at least a part of the sensing line 600 may electrically be connected with the common electrode 700.

For convenience of description, the following embodiments are described in the context of a device in which the sensing line 600 includes the contact portion 600a and is electrically connected with the common electrode 700 through the contact portion 600a.

The common electrode 700 serves as a sensing electrode that senses a touch position of the user. Also, in case of the liquid crystal display device, the common electrode 700 serves to drive a liquid crystal by forming electric field together with the pixel electrode 500. Namely, the common electrode 700 may form a fringe field together with the pixel electrode 500. To this end, the common electrode 700 is provided with a plurality of slits 710. Accordingly, the fringe field is formed between the pixel electrode 500 and the common electrode 700 through the slits 710, and an alignment direction of the liquid crystal may be adjusted by the fringe field. In other words, a fringe field switching mode liquid crystal display device may be obtained.

Also, in order that the common electrode 700 serves as the sensing electrode for sensing the touch position of the user, the plurality of common electrodes 700 are spaced apart from one another on the substrate 100 at a predetermined distance. Each of the plurality of common electrodes 700 is formed at a size corresponding to one or more pixel regions, particularly a size corresponding to the plurality of pixel regions considering a touch area of the user.

After the driving integrated circuit 1 receives a gate control signal from a timing controller (not shown), the driving integrated circuit 1 applies the gate signal to the gate line 200 through the gate pad 215 and the gate in panel 2.

Also, after the driving integrated circuit 1 receives a data control signal from a timing controller (not shown), the driving integrated circuit 1 applies the data signal to the data line 300 through the data pad 315.

The gate in panel 2 applies the gate signal transferred from the driving integrated circuit 1 to the gate line 200, and may be formed in a non-display region of a left side and/or right side of the substrate 100 by a gate in panel (GIP) method together with a manufacturing process of a transistor of each pixel. In another embodiment, the gate in panel 2 may be formed in a structure of a tape carrier package (TCP) or chip on film (COF), or may be formed in a structure of chip on glass (COG) where the gate in panel 2 is packaged on the substrate 100.

Since the touch driver 3 is connected with the sensing line 600, the touch driver 3 receives a touch signal of the user from the sensing line 600. The touch driver 3 detects whether a touch of the user is made and detects a touch position of the user by sensing variations in capacitance caused by the touch of the user.

Figure 3:
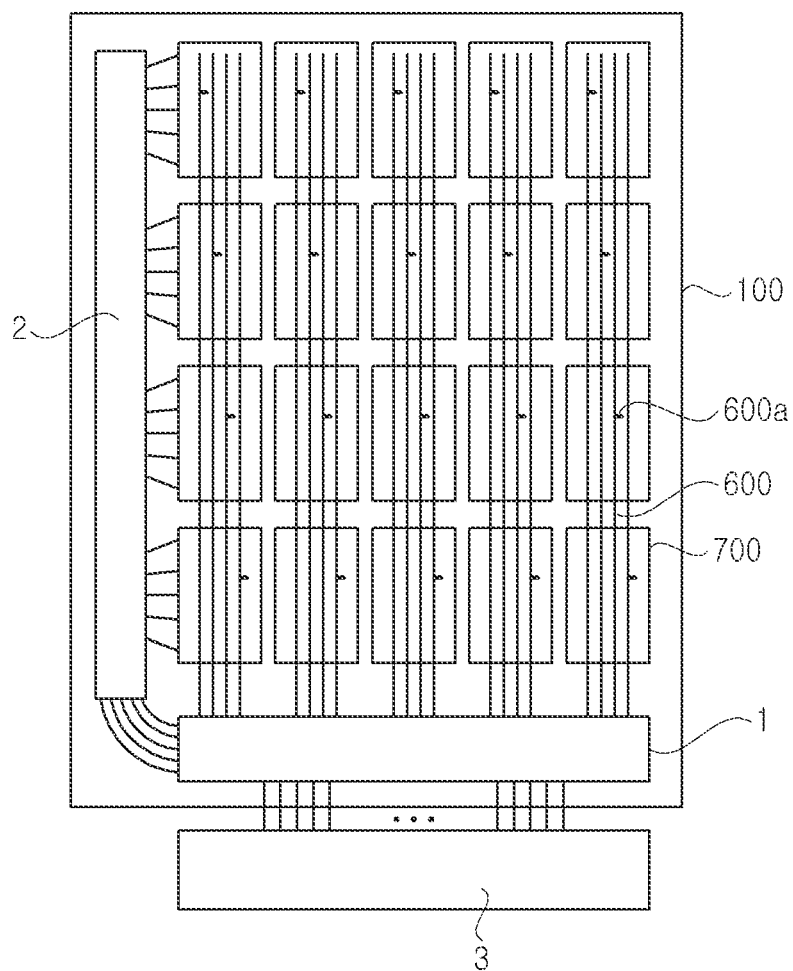
FIG. 3 is a brief plane view illustrating a lower substrate for a liquid crystal display device according to another embodiment of the present invention.

FIG. 3 is a brief plane view illustrating a lower substrate for a liquid crystal display device according to another embodiment of the present invention. The liquid crystal display device of FIG. 3 is the same as the display device of FIG. 2 except for the sensing line 600. Accordingly, the same reference numbers will be used throughout the drawing to refer to the same parts, and repeated description of the same parts will be omitted.

As shown in FIG. 3, according to another embodiment of the present invention, a plurality of sensing lines 600 are connected with a plurality of common electrodes 700 in a one-to-one configuration. Particularly, the plurality of sensing lines 600 are arranged on a display region where images are displayed, at the same length as one another.

According to the aforementioned display device of FIG. 2, one end of the sensing line 600 is extended to the touch driver 3 through the driving integrated circuit 1, and the other end of the sensing line 600 is connected with the contact portion 600a. Namely, according to FIG. 2, the sensing line 600 is extended to the contact portion 600a connected with the common electrode 700, whereby the length of the sensing line 600 connected with the common electrode 700 arranged in the first column is longer than that of the sensing line 600 connected with the common electrode 700 arranged in the second column.

By contrast, according to the display device of FIG. 3, one end of the sensing line 600 is connected with the touch driver 3 through the driving integrated circuit 1, and the other end of the sensing line 600 is extended to a top end of the common electrode 700 arranged in the first column. Accordingly, in FIG. 3, the sensing line 600 connected with the common electrode 700 arranged in the first column is formed in the display region to have the same length as that of the sensing line 600 connected with the common electrode 700 arranged in the second column.

If the plurality of sensing lines 600 are formed in the display region at the same length as one another as shown in FIG. 3, pattern uniformity of the sensing lines 600 is greater than the case where the plurality of sensing lines 600 are formed in the display region at lengths different from one another as shown in FIG. 2, whereby visibility may be improved.

Hereinafter, the display device according to the embodiments of the present invention will be described in more detail through a sectional structure.

First Embodiment

Figure 4:
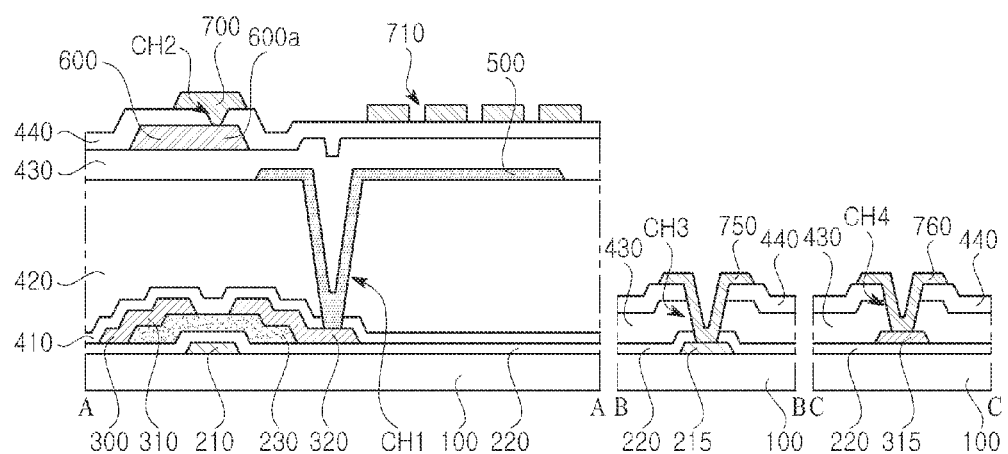
FIG. 4 is a cross-sectional view illustrating a display device according to the first embodiment of the present invention.

FIG. 4 is a cross-sectional view illustrating a display device according to the first embodiment of the present invention, and illustrates cross-sections of lines A-A, B-B and C-C of FIG. 2. The line A-A of FIG. 2 illustrates a thin film transistor region, the line B-B of FIG. 2 illustrates a gate pad region, and the line C-C of FIG. 2 illustrates a data pad region.

As shown in FIG. 4, a gate electrode 210 and a gate pad 215 are formed on a substrate 100. The gate electrode 210 is formed in the thin film transistor region, and the gate pad 215 is formed in the gate pad region. The gate electrode 210 may be extended from the aforementioned gate line 200, and the gate pad 215 is connected with one end of the gate line 200 through a gate in panel 2.

A gate insulating film 220 is formed on the gate electrode 210 and the gate pad 215. The gate insulating film 220 is formed on an entire surface of the substrate except for a third contact hole CH3 region.

A semiconductor layer 230 and a data pad 315 are patterned on the gate insulating film 220. The semiconductor layer 230 is formed in the thin film transistor region, and may be made of a silicon based semiconductor material or oxide semiconductor material. The data pad 315 is formed in the data pad region, and is connected with one end of the aforementioned data line 300.

A source electrode 310 and a drain electrode 320 are patterned on the semiconductor layer 230. The source electrode 310 and the drain electrode 320 are formed in the thin film transistor region. The source electrode 310 is connected with the data line 300, and the drain electrode 320 is spaced apart from the source electrode 310 while facing the source electrode 310.

A first passivation film 410 is formed on the data line 300, the source electrode 310, and the drain electrode 320. The first passivation film 410 is formed at a region except for a first contact hole CH1 region in the thin film transistor region, and is not formed in the gate pad region in which the gate pad 215 is formed and the data pad region in which the data pad 315 is formed. The first passivation film 410 may be made of an inorganic insulating material such as a silicon nitride or a silicon oxide.

A second passivation film 420 is formed on the first passivation film 410. The second passivation film 420 is formed in the thin film transistor region. The second passivation film 420 may be omitted from (i.e., not formed in) the gate pad region and the data pad region. The second passivation film 420 may be made of an organic insulating material such as acrylic resin, which includes a photo active compound (PAC). The second passivation film 420 may be formed at a thickness thicker than that of the first passivation film 410 and may serve to planarize the substrate.

The first passivation film 410 and the second passivation film 420 are structured such that a first contact hole CH1 exists through the first passivation film 410 and the second passivation film 410 that at least partially exposes the drain electrode from the first passivation film 410 and the second passivation film 420.

A pixel electrode 500 is patterned on the second passivation film 420 and at least partially filling the first contact hole CH1 hole through the first and second passivation films. The pixel electrode 500 is formed in the thin film transistor region. The pixel electrode 500 is connected with the drain electrode 320 through a first contact hole CH1. The first contact hole CH1 is made of combination of holes respectively formed in the first passivation film 410 and the second passivation film 420.

A third passivation film 430 is formed on the pixel electrode 500. The third passivation film 430 is formed on the entire surface of the substrate except for regions for a third contact hole CH3 and a fourth contact hole CH4. The third passivation film 430 may be made of an inorganic insulating material such as a silicon nitride or a silicon oxide.

A sensing line 600 provided with a contact portion 600a is patterned on the third passivation film 430. The sensing line 600 is formed in the thin film transistor region.

A fourth passivation film 440 is formed on the sensing line 600. The fourth passivation film 440 is formed on the entire surface of the substrate except for regions for a second contact hole CH2, the third contact hole CH3, and the fourth contact hole CH4. The fourth passivation film 440 may be made of an inorganic insulating material such as a silicon nitride or a silicon oxide.

A common electrode 700, a gate pad electrode 750, and a data pad electrode 760 are patterned on the fourth passivation film 440. The common electrode 700 is formed in the thin film transistor region, the gate pad electrode 750 is formed in the gate pad region, and the data pad electrode 760 is formed in the data pad region.

The common electrode 700, the gate pad electrode 750, and the data pad electrode 760 are formed on one layer by using one material by one process.

The common electrode 700 is patterned to be provided with a plurality of slits 710 therein. The common electrode 700 is connected with the contact portion 600a of the sensing line 600 through the second contact hole CH2 provided in the fourth passivation film 440.

The gate pad electrode 750 is connected with the gate pad 215 through the third contact hole CH3 formed by combination of holes respectively formed in the gate insulating film 220, the third passivation film 430, and the fourth passivation film 440.

The data pad electrode 760 is connected with the data pad 315 through the fourth contact hole CH4 formed by combination of holes respectively formed in the third passivation film 430 and the fourth passivation film 440.

FIGS. 5a to 5i are brief cross-sectional views illustrating manufacturing process steps of a substrate for a display device according to the first embodiment of the present invention, and relate to a process of manufacturing a substrate for the display device shown in FIG. 4.

Figure 5A:
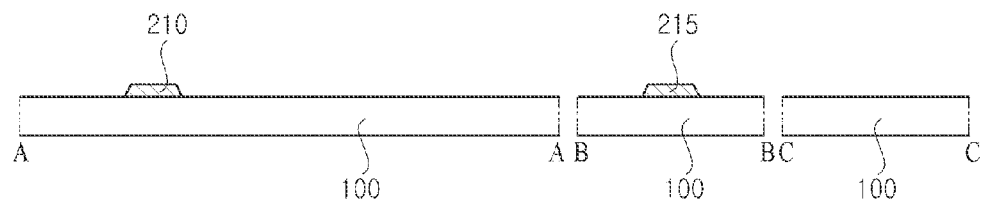
FIGS. 5a to 5i are brief cross-sectional views illustrating manufacturing process steps of a substrate for a display device according to the first embodiment of the present invention.

As shown in FIG. 5a, the gate electrode 210 and the gate pad 215 are patterned on the substrate 100. The gate electrode 210 is formed in the thin film transistor region, and the gate pad 215 is formed in the gate pad region.

The gate electrode 210 and the gate pad 215 may be patterned through a series of mask processes such as photoresist deposition, exposure, developing, etching, and strip after a thin film layer is deposited on the substrate 100 by a sputtering method. A process of forming patterns of elements, which will be described hereinafter, may also be performed through the deposition of the thin film layer and the series of mask processes.

Figure 5B:
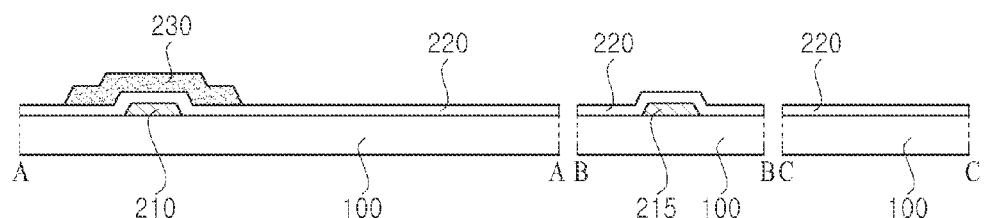

Next, as shown in FIG. 5b, the gate insulating film 220 is formed on the gate electrode 210 and the gate pad 215, and the semiconductor layer 230 is patterned on the gate insulating film 220. The gate insulating film 220 is formed on the entire surface of the substrate by a plasma enhanced chemical vapor deposition (PECVD) method, and the semiconductor layer 230 is formed in the thin film transistor region.

Figure 5C:
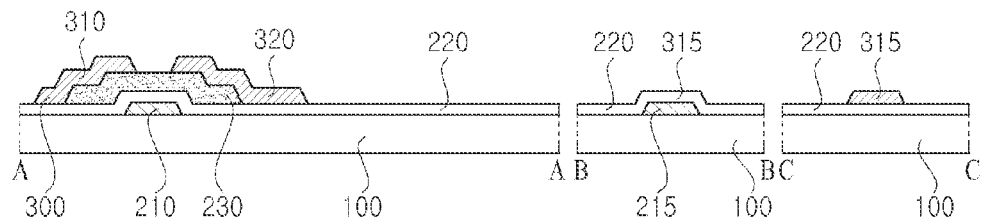

Next, as shown in FIG. 5c, the source electrode 310 and the drain electrode 320, which are connected with the data line 300, are patterned on the semiconductor layer 230 and the data pad 315 is patterned on the gate insulating film 220.

The source electrode 310 and the drain electrode 320 are formed in the thin film transistor region, and the data pad 315 is formed in the data pad region.

Figure 5D:
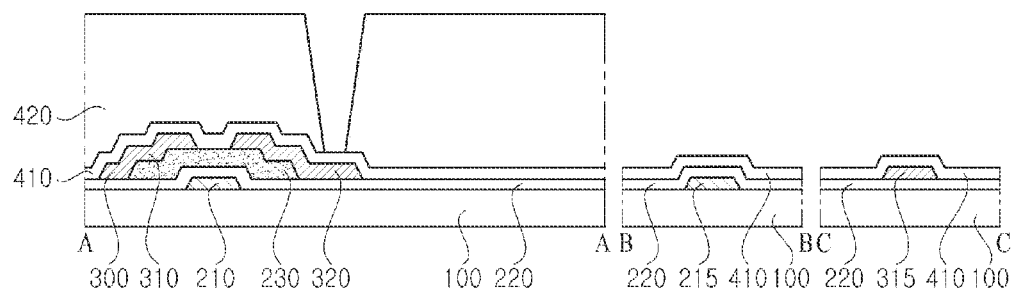

Next, as shown in FIG. 5d, the first passivation film 410 is formed on the data line 300, the data pad 315, the source electrode 310, and the drain electrode 320. The second passivation film 420 is patterned on the first passivation film 410.

The first passivation film 410 is formed on the entire surface of the substrate by the PECVD method.

The second passivation film 420 is formed in the thin film transistor region. In more detail, the second passivation film 420 is patterned by exposure and developing processes after an organic insulating material including a photo active compound (PAC) is deposited on the entire surface of the substrate. The second passivation film 420 is patterned to have a hole constituting the first contact hole CH1.

Figure 5E:
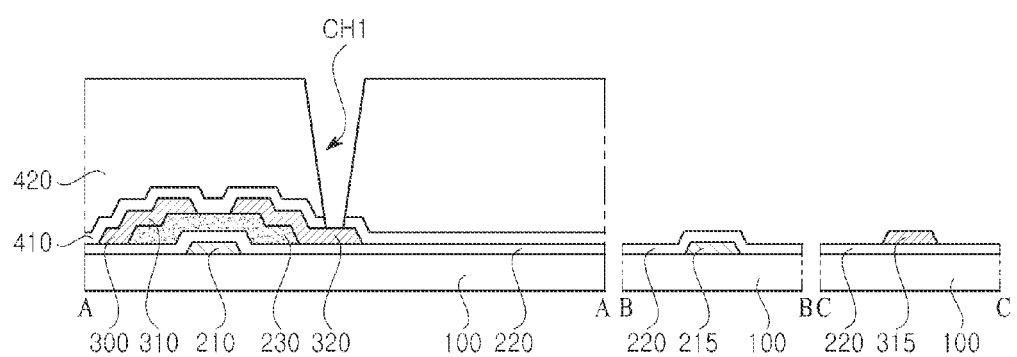

Next, as shown in FIG. 5e, to externally expose the drain electrode 320, the first passivation film 410 region corresponding to the first contact hole CH1 region is etched to complete the first contact hole CH1. In this context, the first passivation film 410 region corresponds to a region exposed by the hole provided in the second passivation film 420 over the first passivation film 410. The drain electrode 320 is externally exposed by the first contact hole CH1. The first passivation film 410 is also etched in the gate pad region and the data pad region.

Figure 5F:
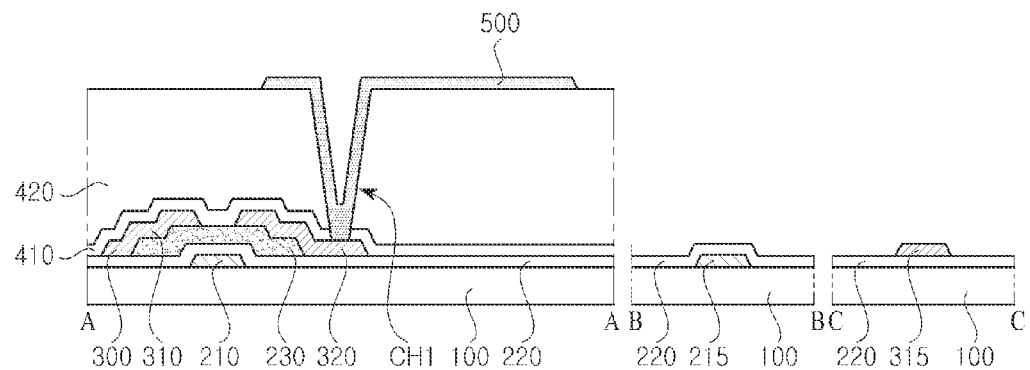

Next, as shown in FIG. 5f, the pixel electrode 500 is patterned on the second passivation film 420. The pixel electrode 500 is patterned in the thin film transistor region, so as to be connected with the drain electrode 320 through the first contact hole CH1.

Figure 5G:
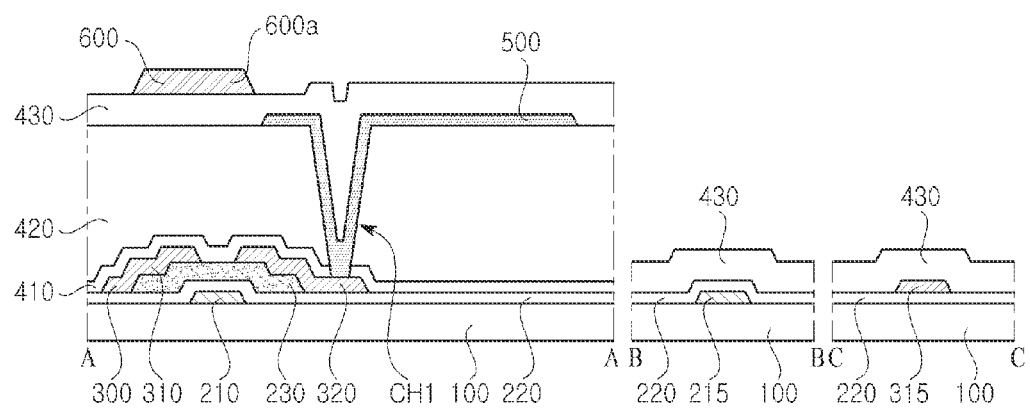

Next, as shown in FIG. 5g, the third passivation film 430 is formed on the pixel electrode 500, and the sensing line 600 provided with the contact portion 600a is patterned on the third passivation film 430.

The third passivation film 430 is formed on the entire surface of the substrate by the PECVD method, and the sensing line 600 is patterned in the thin film transistor region.

Figure 5H:
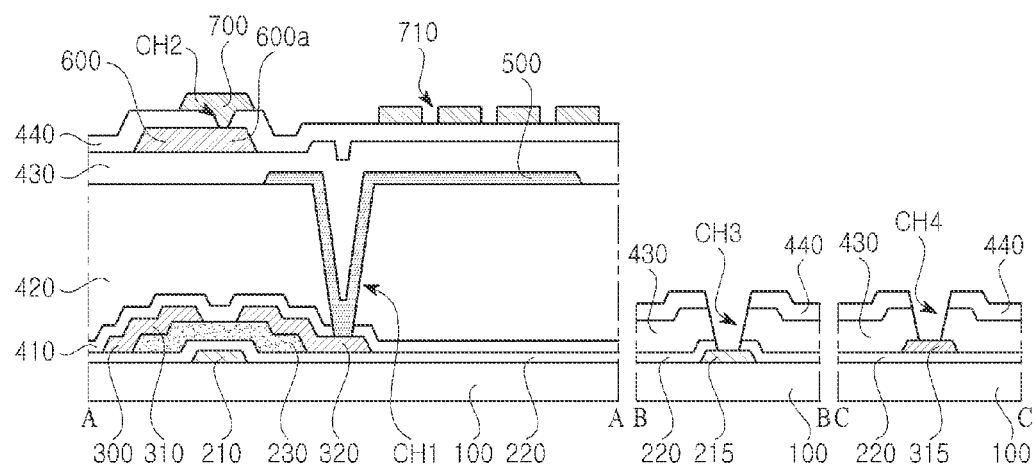

Next, as shown in FIG. 5h, after the fourth passivation film 440 is formed on the sensing line 600, the second contact hole CH2, the third contact hole CH3, and the fourth contact hole CH4 are formed.

The fourth passivation film 440 is formed on the entire surface of the substrate by the PECVD method.

The second contact hole CH2 is formed by etching a predetermined region of the fourth passivation film 440, and the contact portion 600a of the sensing line 600 is externally exposed by the second contact hole CH2.

The third contact hole CH3 is formed by etching predetermined regions of the gate insulating film 220, the third passivation film 430, and the fourth passivation film 440. The gate pad 215 is externally exposed by the third contact hole CH3.

The fourth contact hole CH4 is formed by etching predetermined regions of the third passivation film 430 and the fourth passivation film 440. The data pad 315 is externally exposed by the fourth contact hole CH4.

Figure 5I:
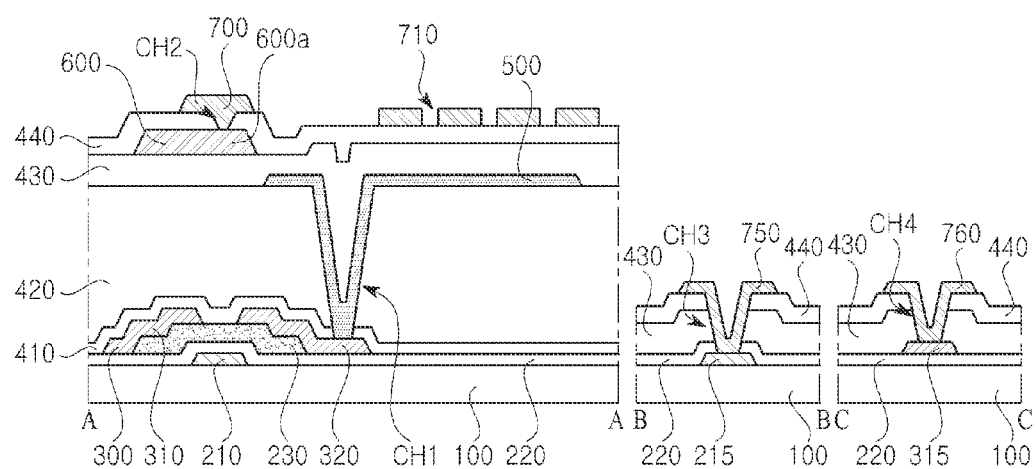

Next, as shown in FIG. 5i, the common electrode 700, the gate pad electrode 750, and the data pad electrode 760 are patterned on the fourth passivation film 440.

The common electrode 700 is patterned in the thin film transistor region, so as to be provided with a plurality of slits 710 therein. Particularly, the common electrode 700 is patterned to be connected with the contact portion 600a of the sensing line 600 through the second contact hole CH2.

The gate pad electrode 750 is patterned in the gate pad region, so as to be connected with the gate pad 215 through the third contact hole CH3.

The data pad electrode 760 is patterned in the data pad region, so as to be connected with the data pad 315 through the fourth contact hole CH4.

Figure 6A:
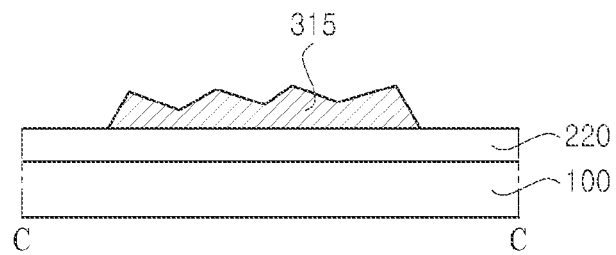
FIGS. 6a to 6c are cross-sectional views illustrating occurrence of under cut in a display device according to the first embodiment of the present invention.
Figure 6B:
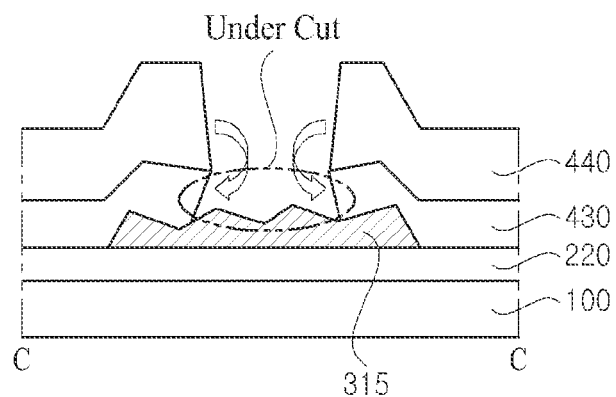
Figure 6C:
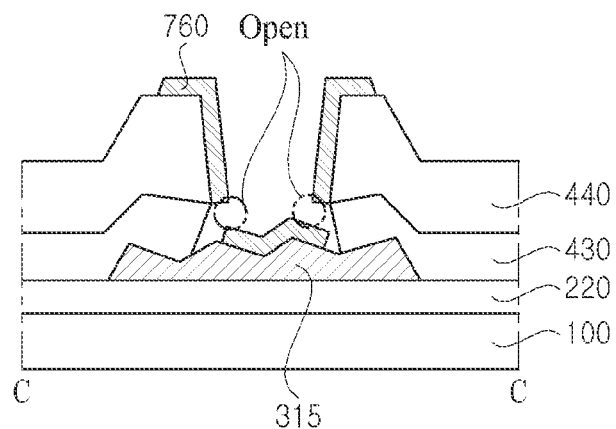

According to the aforementioned method of FIGS. 5a to 5i, when the first passivation film 410 is etched to externally expose the drain electrode 320 during the process of FIG. 5e, morphology of the data pad 315 may be deteriorated due to exposure of the data pad 315 as shown in FIG. 6a. For this reason, as shown in FIG. 6b, when the fourth contact hole CH4 is formed by etching the predetermined regions of the third passivation film 430 and the fourth passivation film 440 in accordance with the process of FIG. 5h, under cut may occur due to gas reflow. As shown in FIG. 6c, due to such under cut, a problem may occur in that the data pad electrode 760 may be opened when the data pad electrode 760 is formed by the process of FIG. 5i.

Hereinafter, a display device and a method of manufacturing the same, which may prevent under cut from occurring, will be described.

Second Embodiment

Figure 7:
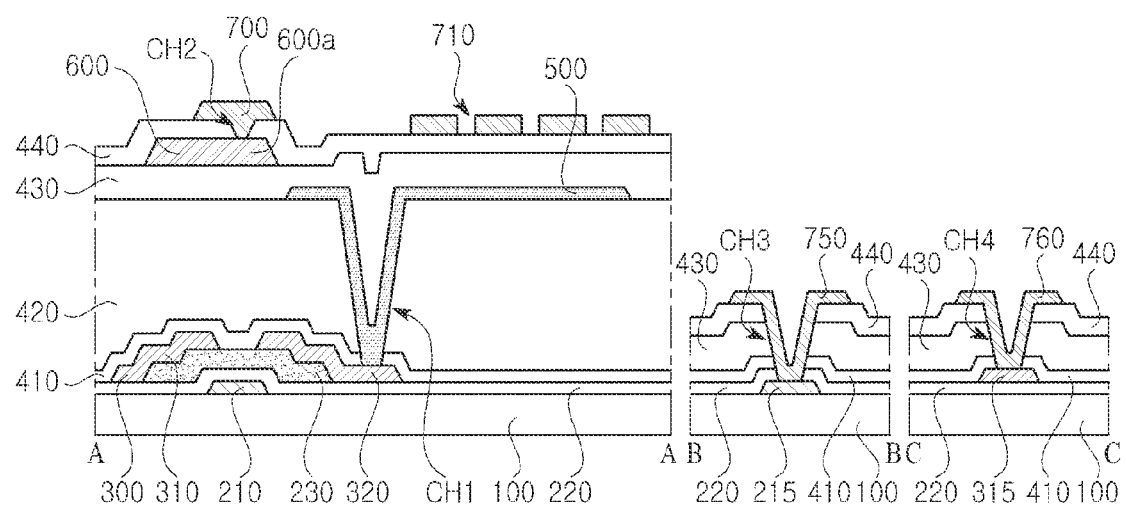
FIG. 7 is a cross-sectional view illustrating a display device according to the second embodiment of the present invention.

FIG. 7 is a cross-sectional view illustrating a display device according to the second embodiment of the present invention, and illustrates cross-sections of lines A-A, B-B and C-C of FIG. 2. The line A-A of FIG. 2 illustrates a thin film transistor region, the line B-B of FIG. 2 illustrates a gate pad region, and the line C-C of FIG. 2 illustrates a data pad region.

As shown in FIG. 7, a gate electrode 210 and a gate pad 215 are patterned on a substrate 100. The gate electrode 210 is formed in the thin film transistor region, and the gate pad 215 is formed in the gate pad region. The gate electrode 210 may be extended from the aforementioned gate line 200, and the gate pad 215 is connected with one end of the gate line 200 through a gate in panel 2.

A gate insulating film 220 is formed on the gate electrode 210 and the gate pad 215. The gate insulating film 220 is formed on an entire surface of the substrate except for a third contact hole CH3 region.

A semiconductor layer 230 and a data pad 315 are patterned on the gate insulating film 220. The semiconductor layer 230 is formed in the thin film transistor region, and may be made of a silicon based semiconductor material or oxide semiconductor material. The data pad 315 is formed in the data pad region, and is connected with one end of the aforementioned data line 300.

A source electrode 310 and a drain electrode 320 are patterned on the semiconductor layer 230. The source electrode 310 and the drain electrode 320 are formed in the thin film transistor region. The source electrode 310 is connected with the data line 300, and the drain electrode 320 is spaced apart from the source electrode 310 while facing the source electrode 310.

A first passivation film 410 is formed on the data line 300, the data pad 315, the source electrode 310, and the drain electrode 320. Namely, in the first embodiment, the first passivation film 410 is formed at a region except for a first contact hole CH1 in the thin film transistor region and is not formed in the gate pad region and the data pad region. However, in the second embodiment, the first passivation film 410 is formed on the entire surface of the substrate except for regions for the first contact hole CH1, a third contact hole CH3, and a fourth contact hole CH4. The first passivation film 410 may be made of an inorganic insulating material such as a silicon nitride or a silicon oxide.

A second passivation film 420 is formed on the first passivation film 410. the second passivation film 420 is formed in the thin film transistor region. The second passivation film 420 may not be formed in the gate pad region and the data pad region. The second passivation film 420 may be made of an organic insulating material such as acrylic resin, which includes a photo active compound (PAC). The second passivation film 420 may be formed at a thickness thicker than that of the first passivation film 410 and may serve to planarize the substrate.

A pixel electrode 500 is patterned on the second passivation film 420. The pixel electrode 500 is formed in the thin film transistor region. The pixel electrode 500 is connected with the drain electrode 320 through the first contact hole CH1. The first contact hole CH1 is made of combination of holes respectively formed in the first passivation film 410 and the second passivation film 420.

A third passivation film 430 is formed on the pixel electrode 500. The third passivation film 430 is formed on the entire surface of the substrate except for regions for the third contact hole CH3 and the fourth contact hole CH4. The third passivation film 430 may be made of an inorganic insulating material such as a silicon nitride or a silicon oxide.

A sensing line 600 provided with a contact portion 600a is patterned on the third passivation film 430. The sensing line 600 is formed in the thin film transistor region.

A fourth passivation film 440 is formed on the sensing line 600. The fourth passivation film 440 is formed on the entire surface of the substrate except for regions for a second contact hole CH2, the third contact hole CH3, and the fourth contact hole CH4. The fourth passivation film 440 may be made of an inorganic insulating material such as a silicon nitride or a silicon oxide.

A common electrode 700, a gate pad electrode 750, and a data pad electrode 760 are patterned on the fourth passivation film 440. The common electrode 700 is formed in the thin film transistor region, the gate pad electrode 750 is formed in the gate pad region, and the data pad electrode 760 is formed in the data pad region.

The common electrode 700, the gate pad electrode 750, and the data pad electrode 760 are formed on one layer by using one material by one process.

The common electrode 700 is patterned to be provided with a plurality of slits 710 therein. The common electrode 700 is connected with the contact portion 600a of the sensing line 600 through the second contact hole CH2 provided in the fourth passivation film 440.

The gate pad electrode 750 is connected with the gate pad 215 through the third contact hole CH3 formed by combination of holes respectively formed in the gate insulating film 220, the first passivation film 410, the third passivation film 430, and the fourth passivation film 440.

The data pad electrode 760 is connected with the data pad 315 through the fourth contact hole CH4 formed by combination of holes respectively formed in the first passivation film 410, the third passivation film 430, and the fourth passivation film 440.

FIGS. 8a to 8j are cross-sectional views illustrating brief manufacturing process steps of a substrate for a display device according to the second embodiment of the present invention, and relate to a process of manufacturing a substrate for the display device shown in FIG. 7.

Figure 8A:
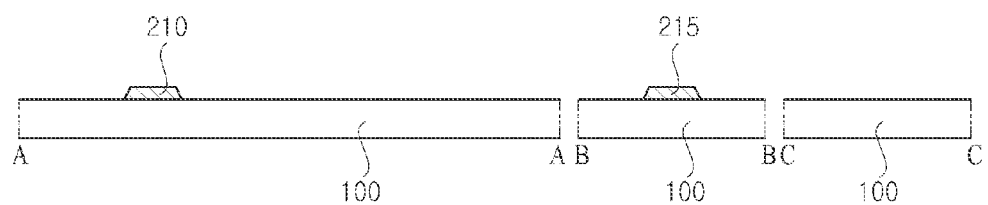
FIGS. 8a to 8j are brief cross-sectional views illustrating manufacturing process steps of a substrate for a display device according to the second embodiment of the present invention.

First of all, as shown in FIG. 8a, the gate electrode 210 and the gate pad 215 are patterned on the substrate 100. The gate electrode 210 is formed in the thin film transistor region, and the gate pad 215 is formed in the gate pad region.

The gate electrode 210 and the gate pad 215 may be patterned through a series of mask processes, such as photoresist deposition, exposure, developing, etching, and strip after a thin film layer is deposited on the substrate 100 by a sputtering method. A process of forming patterns of elements, which will be described hereinafter, may also be performed through the deposition of the thin film layer and the series of mask processes.

Figure 8B:
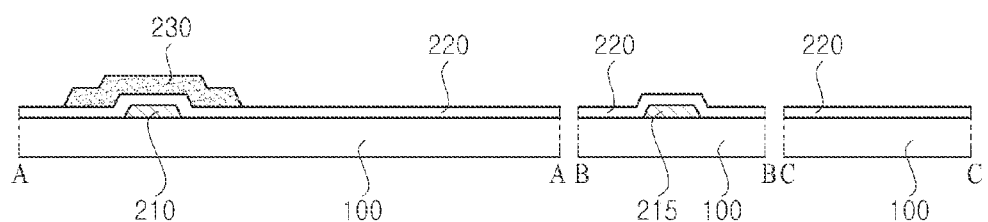

Next, as shown in FIG. 8b, the gate insulating film 220 is formed on the gate electrode 210 and the gate pad 215, and the semiconductor layer 230 is patterned on the gate insulating film 220. The gate insulating film 220 is formed on the entire surface of the substrate by a plasma enhanced chemical vapor deposition (PECVD) method, and the semiconductor layer 230 is formed in the thin film transistor region.

Figure 8C:
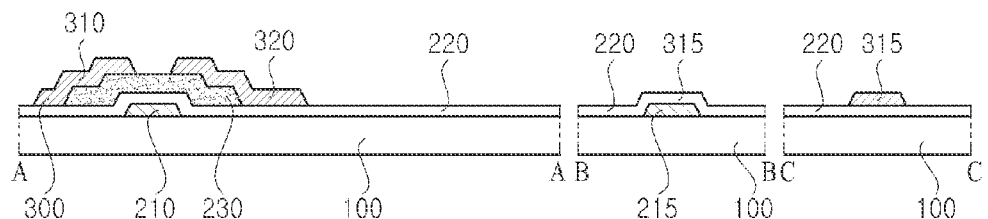

Next, as shown in FIG. 8c, the source electrode 310 and the drain electrode 320, which are connected with the data line 300, are patterned on the semiconductor layer 230, and the data pad 315 is patterned on the gate insulating film 220.

The source electrode 310 and the drain electrode 320 are formed in the thin film transistor region, and the data pad 315 is formed in the data pad region.

Figure 8D:
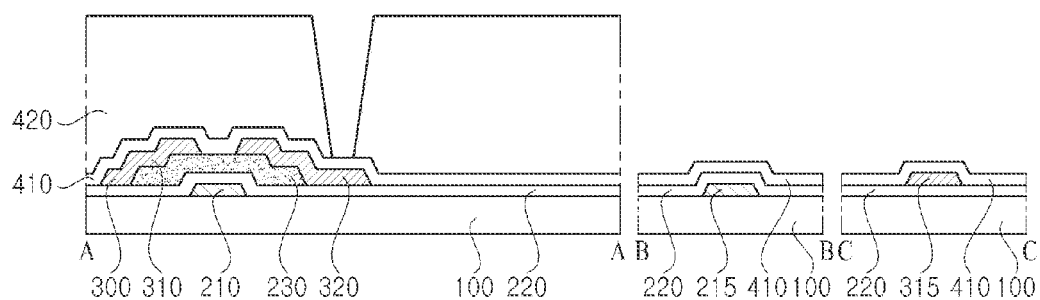

Next, as shown in FIG. 8d, the first passivation film 410 is formed on the data line 300, the data pad 315, the source electrode 310, and the drain electrode 320. The second passivation film 420 is patterned on the first passivation film 410.

The first passivation film 410 is formed on the entire surface of the substrate by the PECVD method.

The second passivation film 420 is formed in the thin film transistor region. In more detail, the second passivation film 420 is patterned by exposure and developing processes after an organic insulating material including a photo active compound (PAC) is deposited on the entire surface of the substrate. The second passivation film 420 is patterned to have a hole constituting the first contact hole CH1.

Figure 8E:
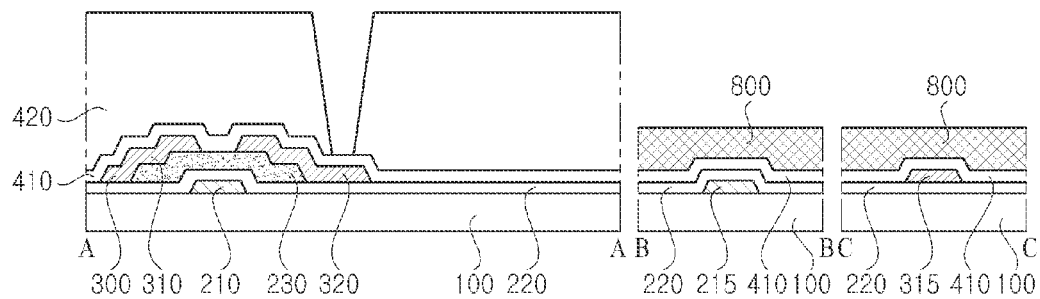

Next, as shown in FIG. 8e, an etching stopper layer 800 is patterned on the first passivation film 410 in the gate pad region and the data pad region. The etching stopper layer 800 is intended to prevent the data pad region from being etched when the first passivation film 410 is etched to form the first contact hole CH1 during a later process (process of FIG. 8f). The etching stopper layer 800 is patterned by exposure and developing processes after an organic insulating material including a photo active compound (PAC) is deposited on the entire surface of the substrate.

Figure 8F:
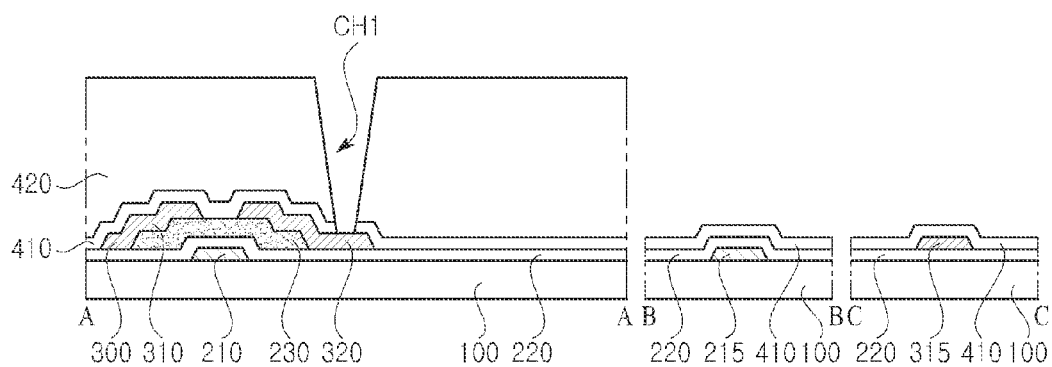

Next, as shown in FIG. 8f, the first passivation film 410 region corresponding to the first contact hole CH1 region, that is, the first passivation film 410 region exposed by the hole provided in the second passivation film 420 is etched, whereby the first contact hole CH1 is completed, and the etching stopper layer 800 is removed.

The drain electrode 320 is externally exposed by the first contact hole CH1.

Figure 8G:
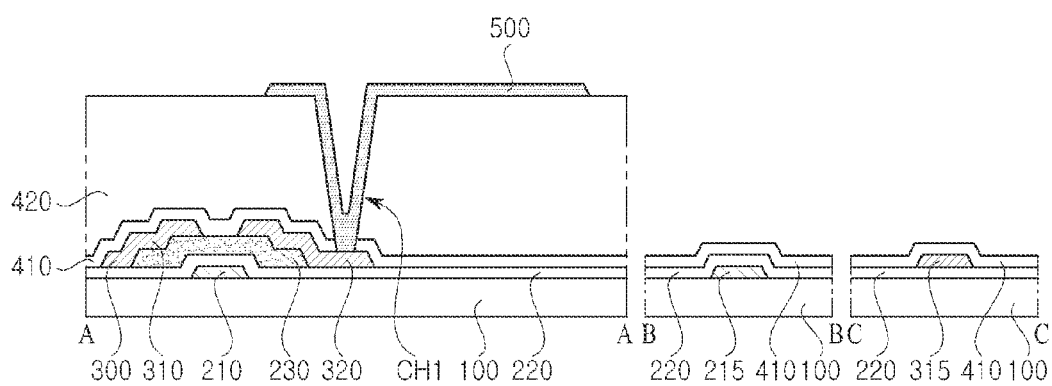

Next, as shown in FIG. 8g, the pixel electrode 500 is patterned on the second passivation film 420. The pixel electrode 500 is patterned in the thin film transistor region, so as to be connected with the drain electrode 320 through the first contact hole CH1.

Figure 8H:
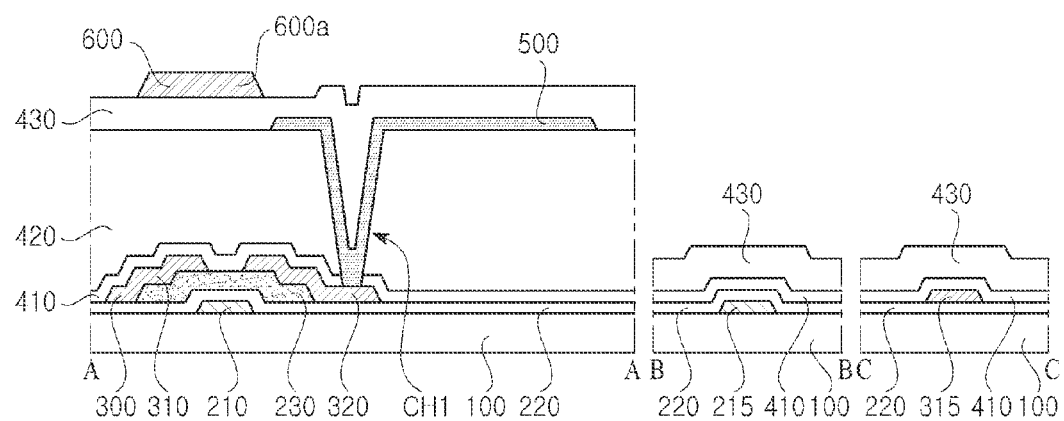

Next, as shown in FIG. 8h, the third passivation film 430 is formed on the pixel electrode 500, and the sensing line 600 provided with the contact portion 600a is patterned on the third passivation film 430.

The third passivation film 430 is formed on the entire surface of the substrate by the PECVD method, and the sensing line 600 is patterned in the thin film transistor region.

Figure 8I:
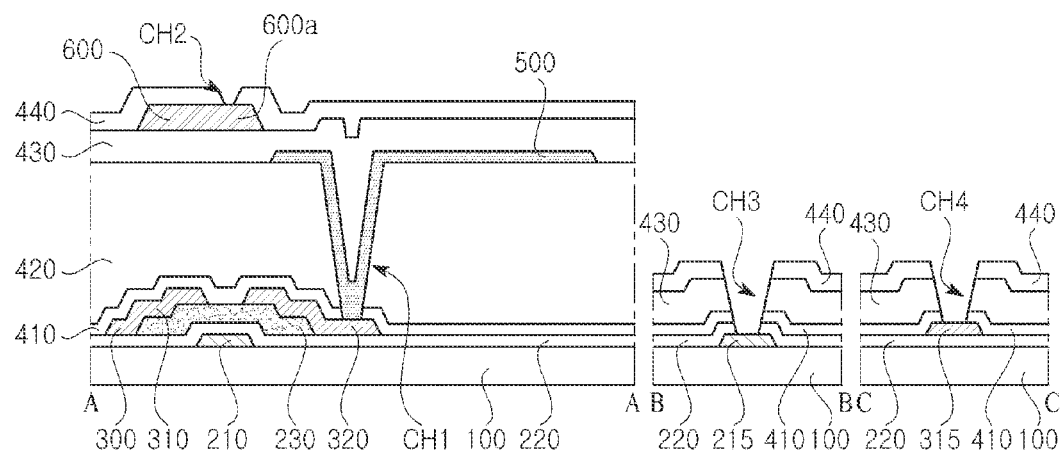

Next, as shown in FIG. 8i, after the fourth passivation film 440 is formed on the sensing line 600, the second contact hole CH2, the third contact hole CH3, and the fourth contact hole CH4 are formed.

The fourth passivation film 440 is formed on the entire surface of the substrate by the PECVD method.

The second contact hole CH2 is formed by etching a predetermined region of the fourth passivation film 440, and the contact portion 600a of the sensing line 600 is externally exposed by the second contact hole CH2.

The third contact hole CH3 is formed by etching predetermined regions of the gate insulating film 220, the first passivation film 410, the third passivation film 430, and the fourth passivation film 440. The gate pad 215 is externally exposed by the third contact hole CH3.

The fourth contact hole CH4 is formed by etching predetermined regions of the first passivation film 410, the third passivation film 430, and the fourth passivation film 440. The data pad 315 is externally exposed by the fourth contact hole CH4.

Figure 8J:
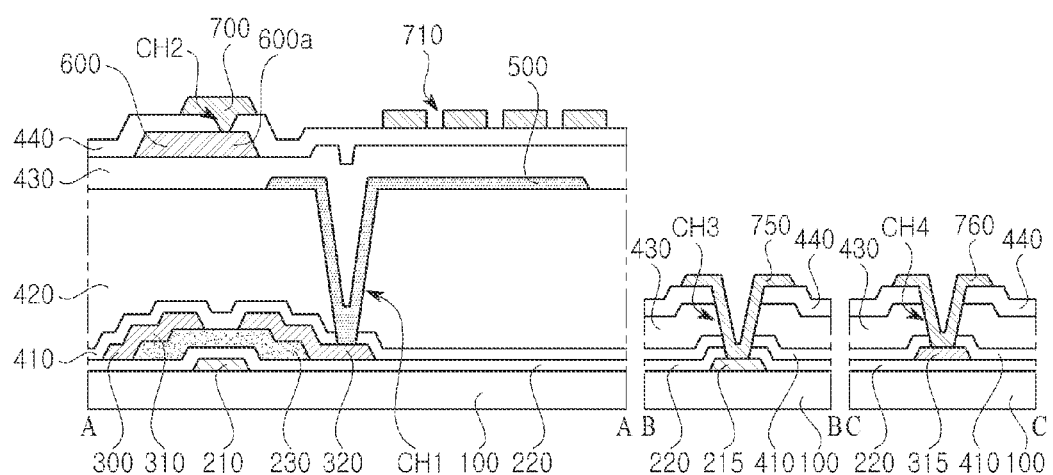

Next, as shown in FIG. 8j, the common electrode 700, the gate pad electrode 750, and the data pad electrode 760 are patterned on the fourth passivation film 440.

The common electrode 700 is patterned in the thin film transistor region, so as to be provided with a plurality of slits 710 therein. Particularly, the common electrode 700 is patterned to be connected with the contact portion 600a of the sensing line 600 through the second contact hole CH2.

The gate pad electrode 750 is patterned in the gate pad region, so as to be connected with the gate pad 215 through the third contact hole CH3.

The data pad electrode 760 is patterned in the data pad region, so as to be connected with the data pad 315 through the fourth contact hole CH4.

Figure 9:
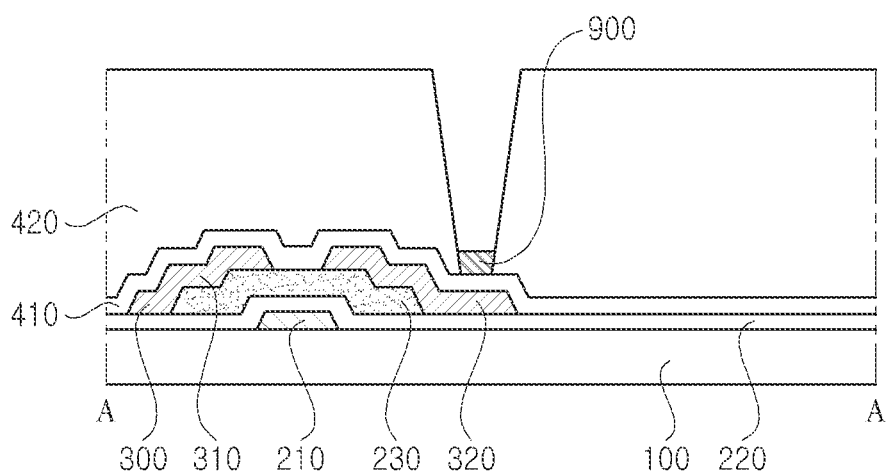
FIG. 9 is a cross-sectional view illustrating an organic insulating material remaining in a display device according to the second embodiment of the present invention.

According to the aforementioned method of FIGS. 8a to 8j, since the etching stopper layer 800 is patterned to prevent the gate pad region from being etched during the process of FIG. 8e, the number of masks is increased, and the organic insulating material constituting the etching stopper layer 800 may remain in the first contact hole CH1 region during the process of patterning the etching stopper layer 800. In other words, the etching stopper layer 800 is patterned by exposure and developing processes after the organic insulating material is deposited on the entire surface of the substrate, so that the organic insulating material remains in the gate pad region and the data pad region only. At this time, as shown in FIG. 9, the organic insulating material 900 may remain in the first contact hole CH1 region without being removed. If the organic insulating material remains in the first contact hole CH1 region, the first passivation film 410 region corresponding to the first contact hole CH1 region is not etched during the process of FIG. 8f, thus preventing the first contact hole CH1 from forming properly.

Hereinafter, a display device and a method of manufacturing the same is described in which a decreased number of masks are used relative to the above described embodiment, and in which the problem of the organic insulating material remaining in the first contact hole CH1 region is prevented.

Third Embodiment

Figure 10:
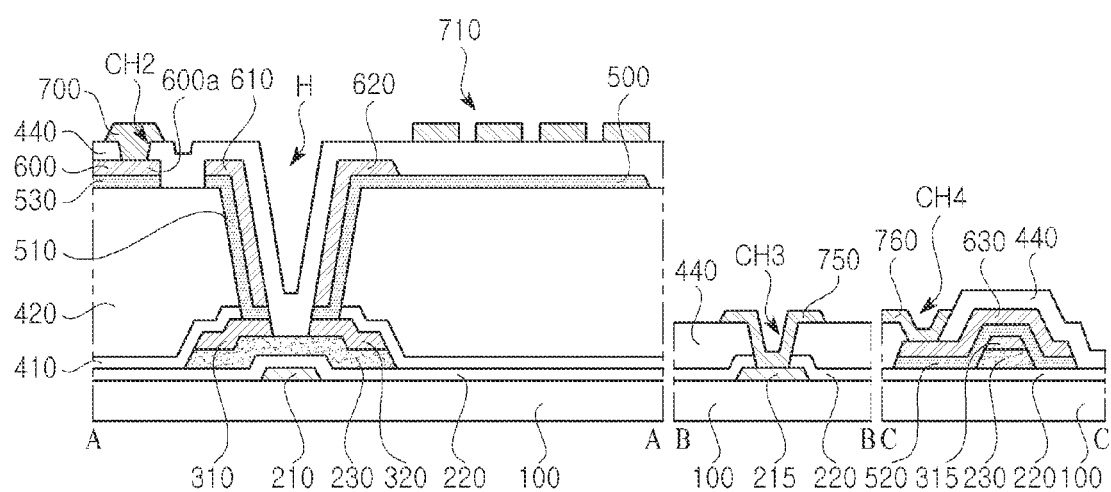
FIG. 10 is a cross-sectional view illustrating a display device according to the third embodiment of the present invention.

FIG. 10 is a cross-sectional view illustrating a display device according to the third embodiment of the present invention, and illustrates cross-sections of lines A-A, B-B and C-C of FIG. 2. The line A-A of FIG. 2 illustrates a thin film transistor region, the line B-B of FIG. 2 illustrates a gate pad region, and the line C-C of FIG. 2 illustrates a data pad region.

As shown in FIG. 10, a gate electrode 210 and a gate pad 215 are formed on a substrate 100. The gate electrode 210 is formed in the thin film transistor region, and the gate pad 215 is formed in the gate pad region. The gate electrode 210 may be extended from the aforementioned gate line 200, and the gate pad 215 is connected with one end of the gate line 200 through a gate in panel 2.

A gate insulating film 220 is formed on the gate electrode 210 and the gate pad 215. The gate insulating film 220 is formed on an entire surface of the substrate except for a third contact hole CH3 region.

A semiconductor layer 230 is patterned on the gate insulating film 220. The semiconductor layer 230 is formed in the thin film transistor region and the data pad region, and may be made of a silicon based semiconductor material or oxide semiconductor material.

A source electrode 310, a drain electrode 320, and a data pad 315 are patterned on the semiconductor layer 230. The source electrode 310 and the drain electrode 320 are formed on the semiconductor layer 230 in the thin film transistor region, and the data pad 315 is formed on the semiconductor layer 230 in the data pad region. At this time, the data pad 315 is connected with one end of the aforementioned data line 300. The source electrode 310 is connected with the data line 300, and the drain electrode 320 is spaced apart from the source electrode 310 while facing the source electrode 310.

Unlike the display device according to the first and second embodiments, in case of the display device according to the third embodiment, after a material layer (not shown) for forming the semiconductor layer 230 and a source/drain electrode layer (not shown) for forming the source electrode 310/the drain electrode 320 are deposited in due order, since the source/drain electrode layer and the material layer are simultaneously patterned by one process using a single mask, the semiconductor layer 230 is formed below the data pad 315 even in the data pad region as well as the thin film transistor region.

Also, in case of the display device according to the third embodiment, as described above, since the source/drain electrode layer and the material layer are simultaneously patterned using a single mask after the source/drain electrode layer is deposited on the material layer for forming the semiconductor layer 230, a tail of the semiconductor layer 230 may be minimized.

A first passivation film 410 is formed on the data line 300, the source electrode 310, and the drain electrode 320. The first passivation film 410 is formed at a region except for an opening region H in the thin film transistor region, and is not formed in the gate pad region provided with the gate pad 215 and the data pad region provided with the data pad 315. The first passivation film 410 may be made of an inorganic insulating material such as a silicon nitride or a silicon oxide.

A second passivation film 420 is formed on the first passivation film 410. The second passivation film 420 is formed in the thin film transistor region. The second passivation film 420 may be omitted (i.e., not formed) in the gate pad region and the data pad region. The second passivation film 420 may be made of an organic insulating material such as acrylic resin, which includes a photo active compound (PAC). The second passivation film 420 may be formed at a thickness thicker than that of the first passivation film 410 and may serve to planarize the substrate.

The first passivation film 410 and the second passivation film 420 are structured such that a hole exists through the first and second passivation films that at least partially exposes the source electrode 310 and the drain electrode 320 from the first passivation film 410 and the second passivation film 420.

A pixel electrode 500, a first passivation electrode 510, and a first connection electrode 520 are patterned on the second passivation film 420. The pixel electrode 500 is formed in the thin film transistor region and at least partially fills the hole through the first passivation film 410 and the second passivation film 420. Particularly, in case of the display device according to the third embodiment, after a material layer (not shown) for forming the pixel electrode 500 is formed on the patterned source/drain electrode layer exposed through the opening region H, the material layer for forming the pixel electrode 500 and the source drain/electrode layer are partially removed when a channel of the thin film transistor is formed. Accordingly, in the third embodiment, the channel of the thin film transistor is formed in a state that the material layer for forming the pixel electrode 500 and the source drain/electrode layer are directly in contact with each other before forming the channel unlike the first and second embodiments in which the pixel electrode 500 is connected with the drain electrode 320 through the first contact hole CH1. As a result, the third embodiment has a structure that the pixel electrode 500 is directly connected with the drain electrode 320 via the hole through the first passivation film 410 and the second passivation film 420. Furthermore, the pixel electrode 500 contacts a region of the drain electrode 320 that is over at least a portion of the gate electrode 210. In other words, a plane perpendicular to the substrate through the region of the drain electrode intersects the portion of the gate electrode 210. In accordance with this structure, in the display device according to the third embodiment, transmittance is more improved than that of the display devices according to the first and second embodiments.

The first passivation electrode 510 is patterned on a region of the second passivation film 420, over the source electrode 310, and serves to prevent the source electrode 310 from being damaged during the etching process for forming the channel of the thin film transistor.

The first connection electrode 520 is formed in the data pad region to cover the entire data pad 315. In more detail, the first connection electrode 520 is formed to cover the data pad 315, and is extended to a region where the data pad 315 is not formed on the gate insulating film 220.

Meanwhile, an auxiliary electrode 530 remains in the region corresponding to the second contact hole CH2 during the process of forming the pixel electrode 500 to form the sensing line 600, which will be described later.

The pixel electrode 500, the first passivation electrode 510, the first connection electrode 520, and the auxiliary electrode 530 are formed on one layer using one material by one process.

The sensing line 600 provided with a contact portion 600a is patterned on the auxiliary electrode 530. A second passivation electrode 610 formed together with the sensing line 600 during the process of patterning the sensing line 600 is patterned on the first passivation electrode 510, a third passivation electrode 620 is patterned on a region of the pixel electrode 500, over the drain electrode 320, and a second connection electrode 630 is patterned on the first connection electrode 520. The second connection electrode 630 is patterned in the same shape as that of the first connection electrode 520.

The second passivation electrode 610 serves to prevent the source electrode 310 from being etched during the process of forming the channel, together with the first passivation electrode 510, and the third passivation electrode 620 serves to prevent the pixel electrode 500 and the drain electrode 320 from being etched during the process of forming the channel.

The second connection electrode 630 serves to connect a data pad electrode 760 with the data pad 315 together with the first connection electrode 520.

The sensing line 600, the second passivation electrode 610, the third passivation electrode 620, and the second connection electrode 630 are formed on one layer using one material by one process.

A fourth passivation film 440 is formed on the sensing line 600, the second passivation electrode 610, the third passivation electrode 620, and the second connection electrode 630. Namely, the fourth passivation film 440 is formed on the entire surface of the substrate except for regions for the second contact hole CH2, the third contact hole CH3, and the fourth contact hole CH4. The fourth passivation film 440 may be made of an inorganic insulating material such as a silicon nitride or a silicon oxide.

A common electrode 700, a gate pad electrode 750, and the data pad electrode 760 are patterned on the fourth passivation film 440. The common electrode 700 is formed in the thin film transistor region, the gate pad electrode 750 is formed in the gate pad region, and the data pad electrode 760 is formed in the data pad region. The common electrode 700 at least partially fills the second contact hole CH2 through the fourth passivation film 440 such that the common electrode 700 is connected with the sensing line 600 through the second contact hole CH2. The gate pad electrode 750 at least partially fills the third contact hole CH3 such that the gate pad electrode 750 is connected with the gate pad 215 through the third contact hole CH3. The data pad electrode 760 at least partially fills the fourth contact hole such that the data pad electrode 760 is connected with the data pad 315 through the first connection electrode 520 and the second connection electrode 630 exposed through the fourth contact hole CH4.

In the display device of the third embodiment, the fourth contact hole CH4 is formed in a region of the fourth passivation film 440, which is not overlapped with and is laterally offset from the data pad 315. In other words, a plane perpendicular to the substrate through the fourth contact hole CH4 does not intersect the data pad 315 in the third embodiment. Accordingly, in the display device of the third embodiment, the data pad 315 is prevented from being etched together with the fourth passivation film 440 when the fourth passivation film 440 is partially removed to form the fourth contact hole, whereby under cut may be prevented from occurring in the data pad 315.

The common electrode 700, the gate pad electrode 750, and the data pad electrode 760 are formed on one layer by using one material by one process.

The common electrode 700 is patterned to be provided with a plurality of slits 710 therein. The common electrode 700 is connected with the contact portion 600a of the sensing line 600 through the second contact hole CH2 provided in the fourth passivation film 440.

The gate pad electrode 750 is connected with the gate pad 215 through the third contact hole CH3 formed by combination of holes respectively formed in the gate insulating film 220, the first passivation film 410, the third passivation film 430, and the fourth passivation film 440.

The data pad electrode 760 is connected with the data pad 315 through the first connection electrode 520 and the second connection electrode 630 exposed through the fourth contact hole CH4 formed in the region which is not overlapped with and is laterally offset from the data pad 315.

FIGS. 11a to 11j are brief cross-sectional views illustrating manufacturing process steps of a substrate for a display device according to the third embodiment of the present invention, and relate to a process of manufacturing a substrate for the display device shown in FIG. 10.

Figure 11A:
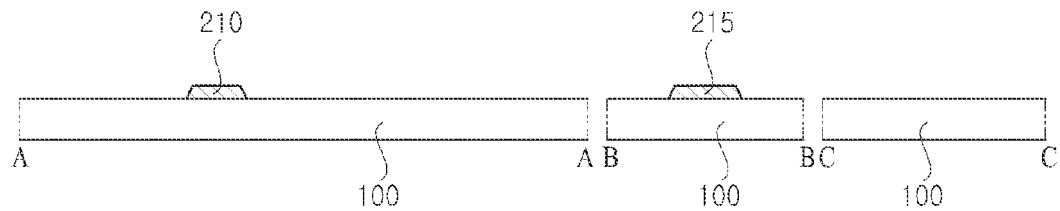
FIGS. 11a to 11g are brief cross-sectional views illustrating manufacturing process steps of a substrate for a display device according to the third embodiment of the present invention.

As shown in FIG. 11a, the gate electrode 210 and the gate pad 215 are patterned on the substrate 100. The gate electrode 210 is formed in the thin film transistor region, and the gate pad 215 is formed in the gate pad region.

The gate electrode 210 and the gate pad 215 may be patterned through a series of mask processes such as photoresist deposition, exposure, developing, etching, and strip after a thin film layer is deposited on the substrate 100 by a sputtering method. A process of forming patterns of elements, which will be described hereinafter, may also be performed through the deposition of the thin film layer and the series of mask processes.

Figure 11B:
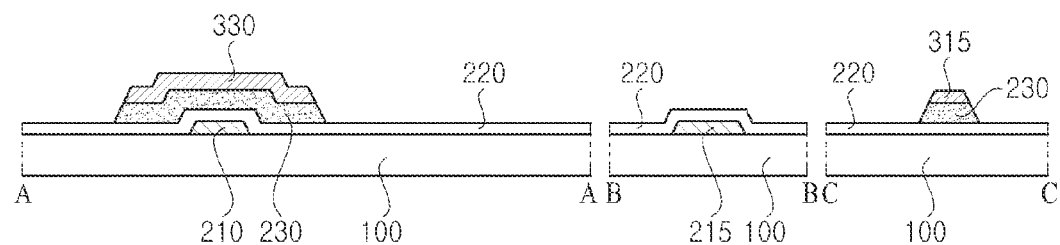

Next, as shown in FIG. 11b, the gate insulating film 220 is formed on the gate electrode 210 and the gate pad 215, a material layer for forming the semiconductor layer 230 and a source/drain electrode layer for forming the source and drain electrodes are formed on the gate insulating film 220. The material layer and the source/drain electrode layer are patterned by one process using a single mask, whereby the semiconductor layer 230 and a source/drain electrode layer pattern 330 are formed. In this process, a first pattern is formed in a thin film transistor region comprising a first portion of the semiconductor layer 230 and a first portion of the source/drain electrode layer pattern 330. A second pattern is formed in the data pad region comprising a second portion of the semiconductor layer 230 and a data pad 315 formed from a second portion of the source/drain electrode layer pattern 330.

The gate insulating film 220 is formed on the entire surface of the substrate by a plasma enhanced chemical vapor deposition (PECVD) method.

Figure 11C:
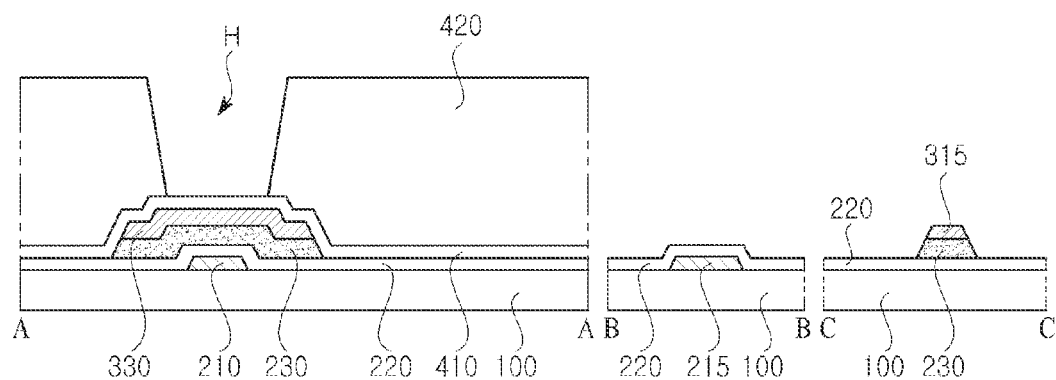

Next, as shown in FIG. 11c, the first passivation film 410 is formed on the source/drain electrode layer pattern 330 and the data pad 315, and the second passivation film 420 is patterned on the first passivation film 410.

The first passivation film 410 is formed on the entire surface of the substrate by the PECVD method.

The second passivation film 420 is formed in the thin film transistor region. In more detail, the second passivation film 420 is patterned by exposure and developing processes after an organic insulating material including a photo active compound (PAC) is deposited on the entire surface of the substrate. The second passivation film 420 is patterned to have an opening region H (i.e., a hole) for partially exposing the first passivation film 410 in the thin film transistor region.

Figure 11D:
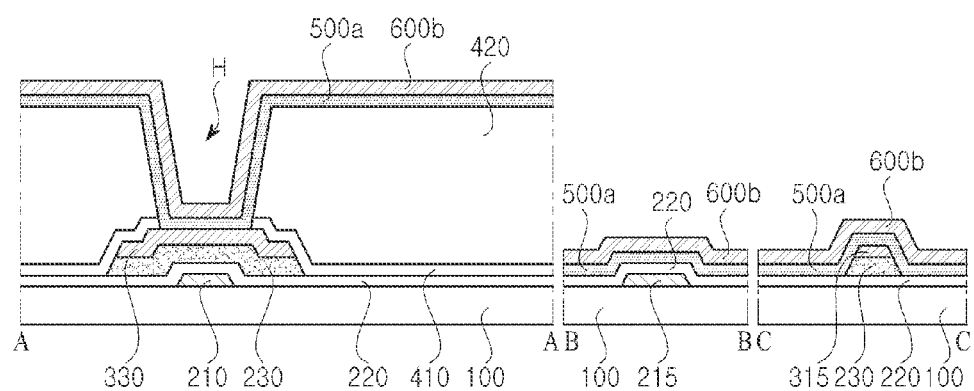

Next, as shown in FIG. 11d, the first passivation film 410 exposed through the opening region H and the first passivation film 410 region formed in the gate pad region and the data pad region are removed by etching. Then, a material layer 500a for forming the pixel electrode 500 and a material layer 600b for forming the sensing line 600 are deposited on the entire surface of the substrate 100. As a result, the material layer 500a for forming the pixel electrode 500 is directly formed on the source/drain electrode layer pattern 330, whereby the pixel electrode 500 is directly in contact with the drain electrode 320 even without a separate contract hole in the same manner as the process which will be described later.

Figure 11E:
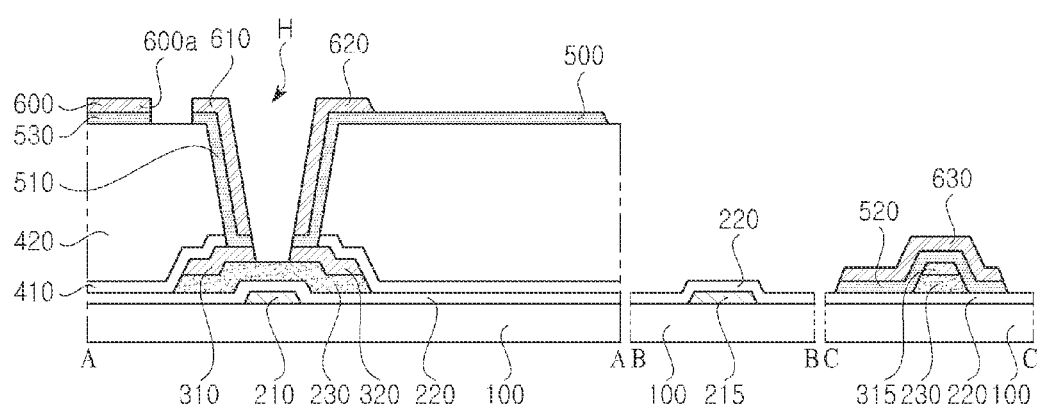

Next, as shown in FIG. 11e, after at least one of the material layer 500a for forming the pixel electrode 500 and the material layer 600b for forming the sensing line 600 is patterned on a region except for a predetermined region through a single process using a half tone mask, at least a part of the source/drain electrode layer pattern 330 exposed through the opening region H is etched, whereby a channel region is formed. The source electrode 310 and the drain electrode 320 are formed on the semiconductor layer 230 by such etching of the source/drain electrode layer pattern 330, whereby the thin film transistor is completed.

In this case, the predetermined region means a region where the sensing line 600 should be formed and the data pad region.

Accordingly, a pattern deposited with the auxiliary electrode 530 and the sensing line 600, a pattern deposited with the first passivation electrode 510 and the second passivation electrode 610, and a pattern deposited with the pixel electrode 500 and the third passivation electrode 620 are formed in the thin film transistor region, a pattern for the pixel electrode 500 is formed in a transmissive region where images are displayed, and a pattern deposited with the first connection electrode 520 and the second connection electrode 630 is formed in the data pad region.

Figure 11F:
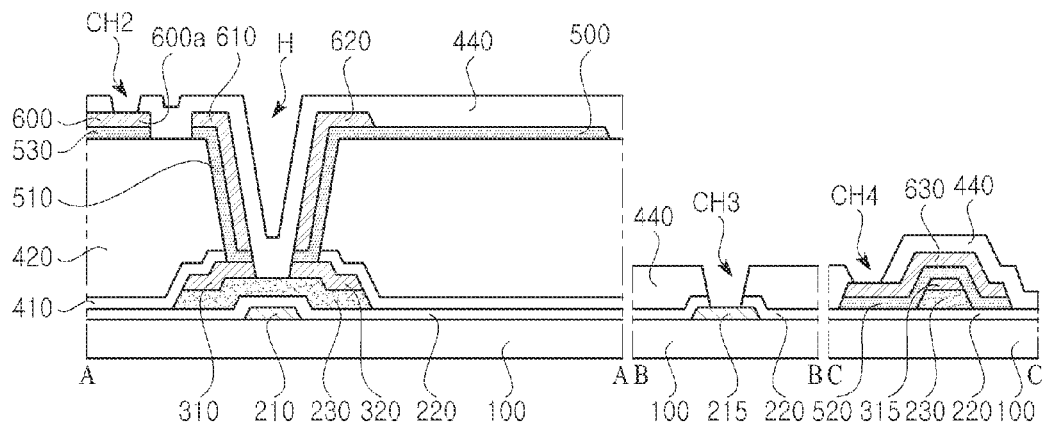

Next, as shown in FIG. 11f, after the fourth passivation film 440 is formed on the entire surface of the substrate 100, the second contact hole CH2, the third contact hole CH3, and the fourth contact hole CH4 are formed.

The fourth passivation film 440 is formed on the entire surface of the substrate by the PECVD method.

The second contact hole CH2 is formed by etching a predetermined region of the fourth passivation film 440, and the contact portion 600a of the sensing line 600 is externally exposed by the second contact hole CH2.

The third contact hole CH3 is formed by etching predetermined regions of the gate insulating film 220 and the fourth passivation film 440, and the gate pad 215 is externally exposed by the third contact hole CH3.

The fourth contact hole CH4 is formed by etching a predetermined region of the fourth passivation film 440, and the second connection electrode 630 is externally exposed by the fourth contact hole CH4. In one embodiment, the fourth contact hole CH4 is formed on a region of the fourth passivation film 440, which is not overlapped with and is laterally offset from the data pad 315. As a result, the data pad 315 may be prevented from being etched when the fourth contact hole CH4 is formed, whereby under cut of the data pad 315 may be prevented from occurring.

Figure 11G:
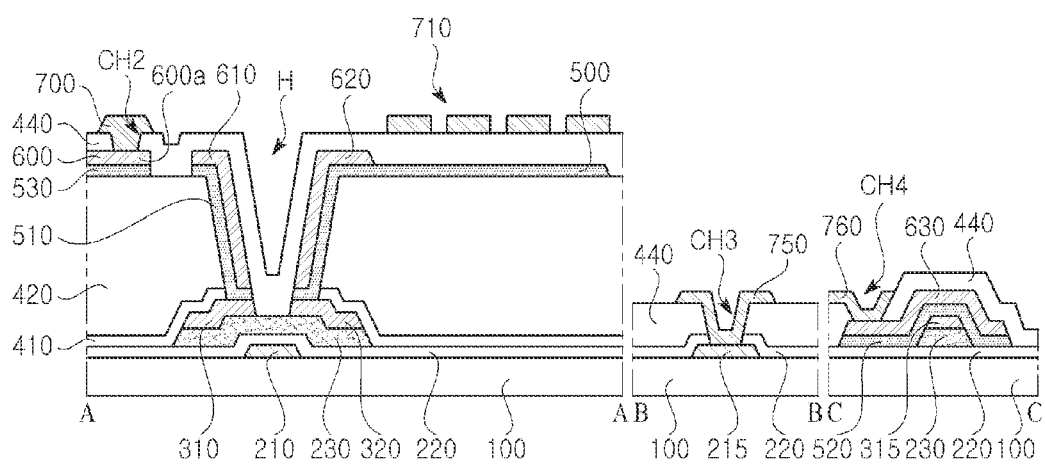

Next, as shown in FIG. 11g, the common electrode 700, the gate pad electrode 750 and the data pad electrode 760 are patterned on the fourth passivation film 440.

The common electrode 700 is patterned in the thin film transistor region, so as to be provided with a plurality of slits 710 therein. Particularly, the common electrode 700 is patterned to be connected with the contact portion 600a of the sensing line 600 through the second contact hole CH2.

The gate pad electrode 750 is patterned in the gate pad region, so as to be connected with the gate pad 215 through the third contact hole CH3.

The data pad electrode 760 is patterned in the data pad region, so as to be connected with the data pad 315 through connection with the first connection electrode 520 and the second connection electrode 630 exposed through the fourth contact hole CH4.

According to the aforementioned method of FIGS. 11a to 11j, since the source/drain electrode layer and the material layer for forming the semiconductor layer 230 are patterned through one process after being sequentially deposited, the number of masks is reduced by 1 as compared with the first embodiment. Since the material layer for forming the pixel electrode 500 and the material layer for forming the sensing line 600 are patterned through one process after being sequentially deposited, the number of masks is additionally reduced by 1 as compared with the first embodiment. As a result, the display device may be manufactured using six masks only. Accordingly, productivity may be maximized through reduction of the manufacturing time.

Also, according to the method of FIGS. 11a to 11j, since under cut occurring in the data pad may be solved even without use of additional passivation film, the number of masks may be reduced as compared with the second embodiment that uses additional passivation film to prevent under cut from occurring, and the problem of the passivation film remaining when additional passivation film is removed may be solved naturally.

The substrate constituting the display device and the method of manufacturing the same have been described as above. The present invention includes various display devices, which may use the aforementioned substrate and the method of manufacturing the same, for example, a liquid crystal display device, a plasma display panel, and an organic light emitting display device, and a method of manufacturing the same.

According to the present invention, the following advantages may be obtained.

As the common electrode is used as the sensing electrode for sensing a touch of the user, a separate touch screen is not required on the display panel unlike the related art, whereby thickness is reduced, the manufacturing process is simplified, and the manufacturing cost is reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:
a thin film transistor in a pixel region having a gate line and a data line crossing the gate line, the thin film transistor having a gate electrode, a semiconductor layer, a source electrode, and a drain electrode;
a first passivation film on the thin film transistor;
a second passivation film on the first passivation film, the first and second passivation films structured such that a hole exists through the first and second passivation films;
a pixel electrode on the second passivation film and at least partially filling the hole through the first and second passivation films, the pixel electrode connected with the drain electrode via the hole through the first and second passivation films;
a sensing line over the second passivation film;
a common electrode connected with the sensing line;
a data pad connected with one end of the data line;
a first connection electrode on the data pad and connected with the data pad;
a second connection electrode on the first connection electrode and connected with the first connection electrode; and
a data pad electrode having a same material as the common electrode, the data pad electrode connected with the data pad through the first connection electrode and the second connection electrode.

2. The display device of claim 1, further comprising:
a third passivation film on the sensing line and the second connection electrode, the third passivation film structured such that a first contact hole and second contact hole exists through the third passivation film, the first contact hole at least partially filled by the common electrode such that the sensing line is connected with the common electrode through the first contact hole, and the second contact hole at least partially filled by the data pad electrode such that the second connection electrode is connected with the data pad electrode through the second contact hole, wherein the second contact hole is in a region of the third passivation film that is laterally offset from the data pad.

3. The display device of claim 1, wherein the pixel electrode is connected with a region of the drain electrode via the hole through the first and second passivation films, the region over the gate electrode.

4. The display device of claim 1, wherein the first connection electrode has a same material as the pixel electrode, and the second connection electrode has a same material as the sensing line.

5. The display device of claim 1, wherein the sensing line is over the data line.

6. The display device of claim 1, further comprising a first passivation electrode having a same material as the pixel electrode, the first passivation electrode on the second passivation film and the source electrode.

7. The display device of claim 6, further comprising a second passivation electrode having a same material as the sensing line, the second passivation electrode on the first passivation electrode.

8. The display device of claim 7, further comprising a third passivation electrode having the same material as the sensing line and the second passivation electrode, the third passivation electrode on the pixel electrode.

9. The display device of claim 8, wherein a third passivation film is on the semiconductor layer, the second passivation electrode, and the third passivation electrode in the hole through the first and second passivation films.

10. The display device of claim 1, further comprising an auxiliary electrode having a same material as the pixel electrode, the auxiliary electrode interposed between the second passivation film and the sensing line.

11. A display device comprising:
a thin film transistor in a pixel region having a gate line and a data line crossing the gate line, the thin film transistor having a gate electrode, a semiconductor layer, a source electrode, and a drain electrode;
a first passivation film on the thin film transistor;
a second passivation film on the first passivation film, the first and second passivation films structured such that a hole exists through the first and second passivation films;
a pixel electrode on the second passivation film and the drain electrode and at least partially filling the hole through the first and second passivation films, the pixel electrode connected with the drain electrode via the hole through the first and second passivation films;
a data pad connected with one end of the data line;
a first connection electrode on the data pad and connected with the data pad;
a second connection electrode on the first connection electrode and connected with the first connection electrode; and a data pad electrode on the second connection electrode, the data pad electrode connected with the data pad; and
a sensing line on the second passivation film, the sensing line over the data line.

12. The display device of claim 11, wherein the pixel electrode contacts a region of the drain electrode via the hole through the first and second passivation films, wherein the region is over the gate electrode.

13. The display device of claim 11, further comprising a first passivation electrode having a same material as the pixel electrode, the first passivation electrode on the second passivation film and the source electrode.

14. The display device of claim 13, further comprising a second passivation electrode having a same material as the sensing line, the second passivation electrode on the first passivation electrode.

15. The display device of claim 14, further comprising a third passivation electrode having the same material as the sensing line and the second passivation electrode, the third passivation electrode on the pixel electrode.

16. The display device of claim 15, further comprising a wherein the third passivation film on the sensing line and the second connection electrode, the third passivation film on the semiconductor layer, the second passivation electrode, and the third passivation electrode in the hole through the first and second passivation films.

17. The display device of claim 11, further comprising an auxiliary electrode having a same material as the pixel electrode, the auxiliary electrode interposed between the second passivation film and the sensing line.

18. The display device of claim 11, wherein the first connection electrode has a same material as the pixel electrode, and the second connection electrode has a same material as the sensing line.

* * * * *